(12) United States Patent
Takashima (10) Patent No.: US 9,330,758 B1
(45) Date of Patent: May 3, 2016

(54) SEMICONDUCTOR MEMORY DEVICE (71) Applicant: Kabushiki Kaisha Toshiba, Minato-ku (JP)

(72) Inventor: Daisaburo Takashima, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/824,204

(22) Filed: Aug. 12, 2015

Related U.S. Application Data (60) Provisional application No. 62/130,770, filed on Mar. 10, 2015.

(51) Int. Cl.
| | | |
|---|---|---|
| G11C 13/00 | (2006.01) | |
| G11C 5/06 | (2006.01) | |
| G11C 5/02 | (2006.01) | |

(52) U.S. Cl.
CPC .......... *G11C 13/0069* (2013.01); *G11C 13/004* (2013.01); *G11C 5/06* (2013.01); *G11C 13/0002* (2013.01); *G11C 2213/79* (2013.01)

(58) Field of Classification Search
CPC ... G11C 13/0002; G11C 2213/79; G11C 5/06
USPC ....................................... 365/148, 51, 63, 72
See application file for complete search history.

(56) References Cited

U.S. PATENT DOCUMENTS

| | | | |
|---|---|---|---|
| 5,894,447 A | 4/1999 | Takashima | |
| 7,583,528 B2 | 9/2009 | Aoki | |
| 8,792,266 B2 | 7/2014 | Takashima | |
| 2003/0198080 A1* | 10/2003 | Iwata | 365/158 |
| 2007/0211514 A1* | 9/2007 | Liaw et al. | 365/148 |
| 2012/0147659 A1* | 6/2012 | Carter et al. | 365/148 |
| 2014/0301130 A1* | 10/2014 | Siau et al. | 365/148 |

FOREIGN PATENT DOCUMENTS

| | | |
|---|---|---|
| JP | 11-354728 | 12/1999 |
| JP | 2003-141874 | 5/2003 |
| JP | 2013-196720 | 9/2013 |
| WO | WO 2006/095389 A1 | 9/2006 |

OTHER PUBLICATIONS

U.S. Appl. No. 14/838,535, filed Aug. 28, 2015, Takashima.

* cited by examiner

*Primary Examiner* — Ly D Pham
(74) *Attorney, Agent, or Firm* — Oblon, McClelland, Maier & Neustadt, L.L.P.

(57) ABSTRACT

According to one embodiment, a semiconductor memory device includes a series connection including first to Nth (N being an integer greater than or equal to 2) two-terminal-type resistance change memory elements connected in series with one another, and having first to (N+1)th terminals from one end thereof to the other end thereof, a first, second, third, and fourth bit lines, first transistors connected between the first bit line and odd-numbered terminals of the series connection, one or more second transistors connected between the second bit line and one or more even-numbered terminals of the series connection, a third transistor connected between the third bit line and the first terminal of the series connection, and a fourth transistor connected between the fourth bit line and the (N+1)th terminal of the series connection.

16 Claims, 8 Drawing Sheets

SEMICONDUCTOR MEMORY DEVICE

CROSS-REFERENCE TO RELATED APPLICATIONS

This application claims the benefit of U.S. Provisional Application No. 62/130,770, filed Mar. 10, 2015, the entire contents of which are incorporated herein by reference.

FIELD

Embodiments described herein relate generally to semiconductor memory devices.

BACKGROUND

Phase change memories (PRAM, PCM), resistance change memories (RRAM, ReRAM), magnetoresistive memories (MRAM), etc., are proposed as nonvolatile semiconductor memory devices. Each of these memories is a semiconductor memory device which uses resistance change memory elements.

A semiconductor memory device using resistance change memory elements executes writing and reading by passing current through the resistance change memory elements. Therefore, if transistors and bit lines vary in resistance, a voltage drop will occur, and thus the voltage applied to every resistance change memory element and the current which flows into every resistance change memory element will change. As a result, it will be difficult to suitably perform read operation and write operation.

Provision of read only transistors in addition to the usual select transistors may avoid the above mentioned problem, but two transistors per memory cell will be needed in this case. This means that the cell size per memory cell will be large. Therefore, a semiconductor memory device that not only achieves reduction in transistor count per memory cell but also suitably performs both read operation and write operation is desired.

DETAILED DESCRIPTION

In general, according to one embodiment, a semiconductor memory device includes: a series connection including first to Nth (N being an integer greater than or equal to 2) two-terminal-type resistance change memory elements connected in series with one another, and having first to (N+1)th terminals from one end thereof to the other end thereof; a first, second, third, and fourth bit lines; first transistors connected between the first bit line and odd-numbered terminals of the series connection; one or more second transistors connected between the second bit line and one or more even-numbered terminals of the series connection; a third transistor connected between the third bit line and the first terminal of the series connection; and a fourth transistor connected between the fourth bit line and the (N+1)th terminal of the series connection.

Hereafter, embodiments will be described with reference to the drawings.

Embodiment 1

Figure 1:
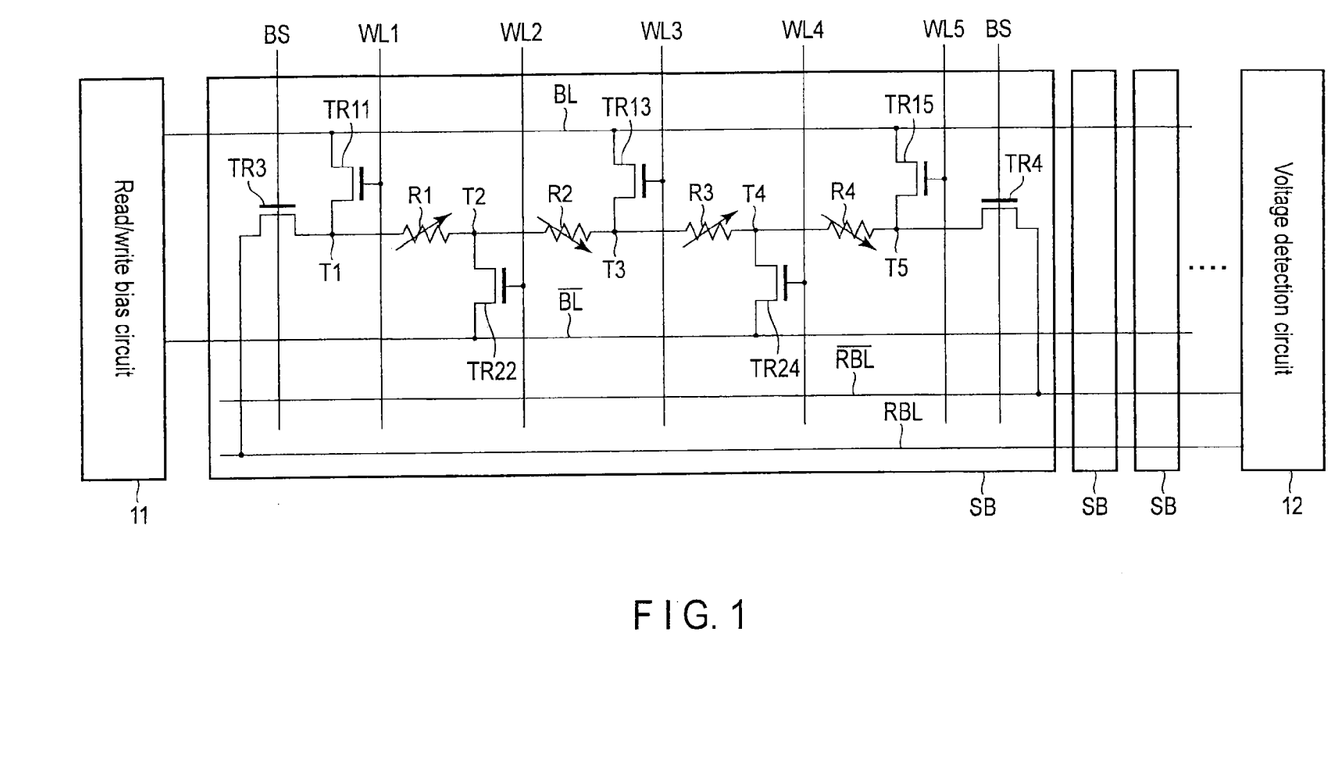
FIG. 1 is a view illustrating the structure of an equivalent circuit of a semiconductor memory device in a first embodiment.

FIG. 1 is a view illustrating the structure of an equivalent circuit of a semiconductor memory device in a first embodiment.

The semiconductor memory device illustrated in FIG. 1 comprises four serially connected two-terminal-type resistance change memory elements R1-R4. Moreover, the series connection has terminals T1-T5 from its left end toward its right end. Generally speaking, the series connection has first to Nth (N is an integer greater than or equal to 2) resistance change memory elements and first to (N+1)th terminals from its one end toward its other end.

Any resistance change memory element can establish two states, namely a high resistance state and a low resistance state, and can store information (1 or 0) according to whether it is in a high resistance state or in a low resistance state. That is, according to write information, a high resistance state or a low resistance state is set to a resistance change memory element, and a high resistance state or a low resistance state is read as information from a resistance change memory element.

Moreover, the semiconductor memory device illustrated in FIG. 1 is provided with a first bit line BL, a second bit line /BL, and a third bit line RBL, and a fourth bit line /RBL. The first bit line BL, the second bit line /BL, the third bit line RBL, and the fourth bit line /RBL extend in parallel with one another.

Each of the first transistors (select transistors) TR11, TR13, and TR15 are connected between the first bit line BL and a corresponding one of the odd-numbered terminals T1, T3, and T5 of the series connection. Each of the second transistors (select transistors) TR22 and TR24 are connected between the second bit line /BL and a corresponding one of the even-numbered terminals T2 and T4 of the series connection.

The transistors TR11, TR22, TR13, TR24, and TR15 are respectively connected to word lines WL1, WL2, WL3, WL4, and WL5 through their respective gate electrodes.

As mentioned above, one end of each of the resistance change memory elements is connected through the corresponding one of the select transistors to the bit line BL, and the other end of each of the resistance change memory elements is connected through the corresponding one of the select transistor to the bit line /BL.

A third transistor TR3 is connected between the third bit line RBL and the first terminal T1 of the series connection. A fourth transistor TR4 is connected between the fourth bit line /RBL and the fifth terminal T5 of the series connection. The third transistor TR3 and the fourth transistor TR4 individually function as a read only select transistor.

A read/write bias circuit 11 is connected to the first bit line BL and the second bit line /BL, and the voltage detecting circuit 12 is connected to the third bit line RBL and the fourth bit line /RBL.

The resistance change memory elements R1-R4, the first transistors TR11, TR13 and TR15, the second transistors TR22 and TR24, the third transistor TR3, and the fourth transistor TR4 constitute one memory cell block SB. There are arranged a plurality of such memory cell blocks.

Next, read operation of the semiconductor memory device of this embodiment will be explained.

For example, when reading information from the jth (j is an integer which satisfies 1≤j≤N) resistance change memory element, more specifically, when reading information from the jth resistance change memory element of the series connection illustrated in FIG. 1, the following operations will be performed.

In this read operation, the two select transistors connected to the two respective ends (the jth terminal and the (j+1)th terminal) of the jth resistance change memory element are individually set in an ON state, and all of the other select transistors is set in an OFF state. And the application of voltage between the bit lines BL and /BL causes current to flow through the jth resistance change memory element alone. Furthermore, when the memory cell block selection signal BS is made high, the read only select transistors TR3 and TR4 will be set in an ON state, and the voltage applied to the jth resistance change memory element will be read between the bit line RBL and /RBL.

Figure 2:
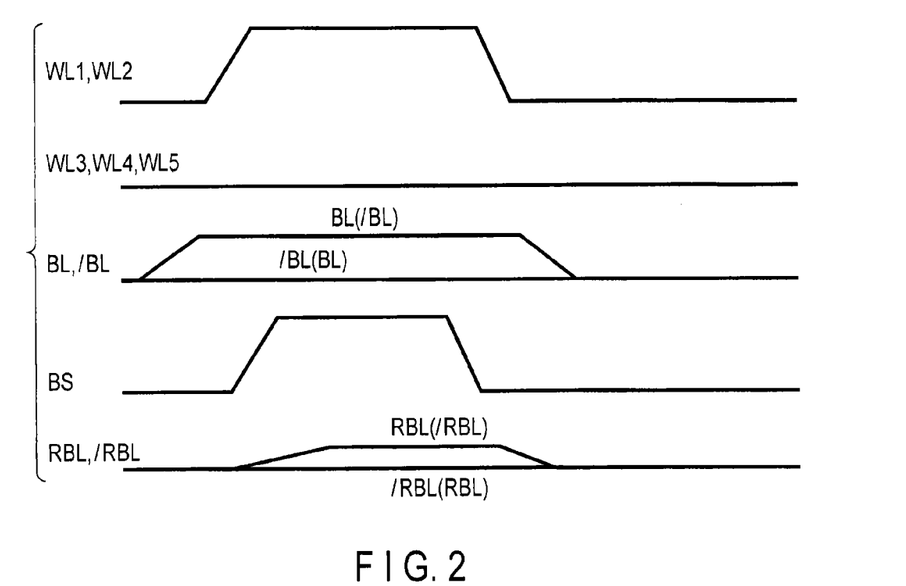
FIG. 2 is a timing chart illustrating read operation of the semiconductor memory device in the first embodiment.

FIG. 2 is a timing chart illustrating the details of read operation. Here, the case where the first resistance change memory element R1 is chosen will be explained.

First, a read voltage is applied between the bit lines BL and /BL, and a select voltage is applied to each of the word lines WL1 and WL2. Then, the select transistors TR11 and TR22 will be in an ON state, which causes voltage to be applied only to the resistance change memory element R1, and current to flow only through the resistance change memory element R1. As a result, the voltage of "IR" occurs across the both ends of the resistance change memory element R1, wherein "I" denotes the current which flows through the resistance change memory element R1, and "R" denotes the resistance of the resistance change memory element R1.

Second, the memory cell block selection signal BS is made high, and the read only select transistors TR3 and TR4 will be made in an ON state. As a result, the voltage of one terminal T1 of the resistance change memory element R1 is read to the bit line RBL, and the voltage of the other terminal T2 of the resistance change memory element R1 is read to a bit line /RBL.

The bit lines RBL and /RBL are designed to be high in impedance. During the transitional period after the read only select transistors TR3 and TR4 have been turned on, the parasitic capacitance of the bit lines RBL and /RBL may cause voltage to occur between the bit line RBL and the terminal T1 of the resistance change memory element R1, whereas the resistance change memory elements, the read only select transistors, and so forth may cause a voltage drop to occur between the bit line /RBL and the terminal T2 of the resistance change memory element R1. However, as time goes by, a steady state will come. Then, the terminal T1 of the resistance change memory element R1 and the voltage detecting circuit 12 side of the bit line RBL will agree with each other in potential. Furthermore, the terminal T2 of the resistance change memory element R1 and the voltage detecting circuit 12 side of the bit line /RBL will agree with each other in potential. Therefore, it becomes possible that the voltage detecting circuit 12 will correctly detect the voltage difference across the two ends of the resistance change memory element R1.

This embodiment therefore makes it possible, even if the bit lines and the select transistors vary in resistance, to correctly detect the voltage occurring across the two ends of the resistance change memory element R1, thereby achieving exact read operation.

Moreover, in this embodiment, one memory cell block comprises N resistance change memory elements, N+1 select transistors, and two read only select transistors. Therefore, it is possible to construct one memory cell out of one resistance change memory element and (N+3)/N transistors. As a result, if the number of memory cells included in one memory cell block increases, it will be generally possible to constitute one memory cell from one transistor and one resistance change memory element. Therefore, this embodiment surely achieves reduction in cell size per memory cell.

Next, write operation of the semiconductor memory device of this embodiment will be explained.

For example, when information is written to the kth (k is an integer which satisfies 1≤k≤N) resistance change memory element, more specifically, when information is written to the kth resistance change memory element of the series connection illustrated in FIG. 1, the following operations will be performed.

In this write operation, two select transistors connected to the two respective ends (the kth terminal and the (k+1)th terminal) of the kth resistance change memory element are set in an ON state, and the rest select transistors are set in an OFF state. Thereafter, voltage or current is supplied between the bit lines BL and /BL according to the information (0 or 1) to be written to the kth resistance change memory element. Then, information will be written to the kth resistance change memory element. That is, the kth resistance change memory element is set in a high resistance state or in a low resistance state.

How to write information (How to set a resistance change memory element in either a high resistance state or a low resistance state) is dependent on what type of resistance change memory element it is. In the case of bipolar cells, such as RRAM's and MRAM's, desired information can be written to them by changing the polarity or value of the voltage or current supplied between the bit lines BL and /BL. In the case of PRAM's or unipolar operation type RRAM's, desired information can be written to them by changing the value or wave timing of the voltage or current supplied between the bit lines BL and /BL.

Moreover, it is also possible to perform write operation using the following methods. For example, when information is written to the kth (k is an integer which satisfies 1≤k≤N) resistance change memory element, the following operations will be performed.

In this write operation, it also happens that two select transistors connected to the respective ends (the kth terminal and the (k+1)th terminal) of the kth resistance change memory element are set in an ON state and the rest select transistors are set in an OFF state. Thereafter, voltage or current is supplied between the bit lines BL and /BL according to the information (0 or 1) to be written to the kth resistance change memory element. At the moment, the read only select transistors TR3 and TR4 are also set in an ON state. As a result, the voltage applied to the kth resistance change memory element can be read between the bit lines RBL and /RBL. And, based on the voltage read between the bit lines RBL and /RBL, the voltage or current supplied between the bit lines BL and /BL will be controlled.

Execution of such feedback control makes it possible to suitably supply voltage and current to every resistance change memory element. That is, even if voltage applied to any one resistance change memory element changes by resistive variation among transistors or wires, voltage and current can be suitably supplied to the resistance change memory element because the voltage across the two ends of every resistance change memory element is monitored. For example, when the monitor voltage across the two ends of a resistance change memory element is low, the voltage supplied between the bit lines BL and /BL is made to increase. Moreover, when resistance of a resistance change memory element has temperature dependency, suitable voltage and current can be also supplied to the resistance change memory element because the voltage across the two ends of the resistance change memory element is monitored.

Figure 3:
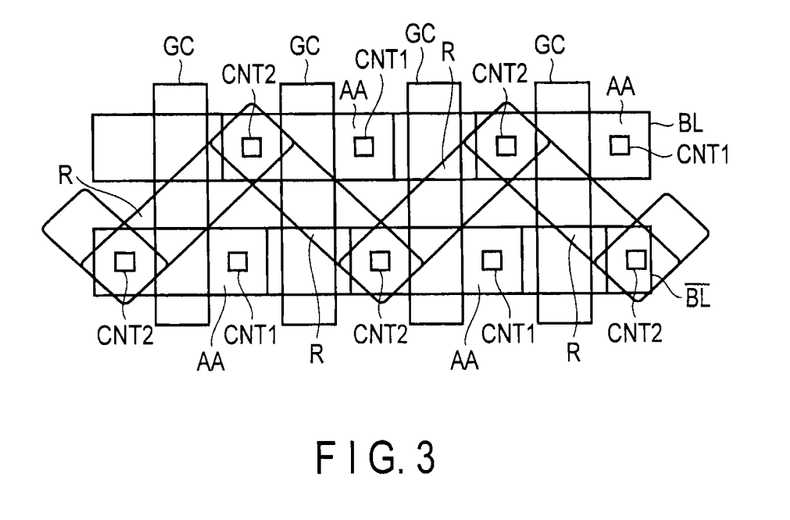
FIG. 3 is a view schematically illustrating the planar composition of the first exemplary device structure of the semiconductor memory device in the first embodiment.
Figure 4:
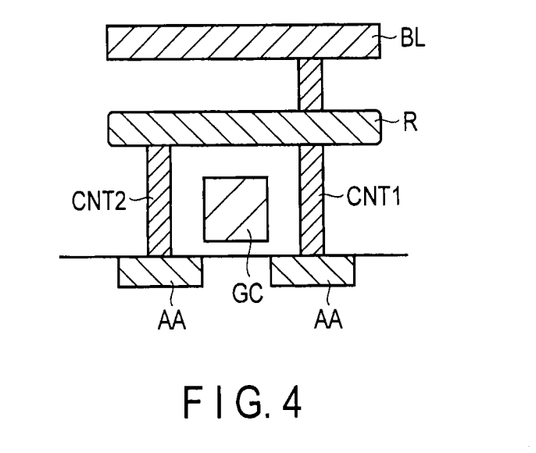
FIG. 4 is a view schematically illustrating the sectional composition of the first exemplary device structure of the semiconductor memory device in the first embodiment.

FIG. 3 is a view (planar pattern figure) schematically illustrating the planar composition of the first exemplary device structure of the semiconductor memory device in the present embodiment. FIG. 4 is a view schematically illustrating the sectional composition of the first exemplary device structure of the semiconductor memory device in the present embodiment.

In this compositional example, the two ends of each resistance change memory element are arranged along an axis parallel to the principal plane of a semiconductor substrate where the select transistors and the read only select transistors are provided.

Specifically, as illustrated in FIG. 3 and FIG. 4, the bit line BL and the bit line /BL are arranged to extend in parallel with each other, whereas the gate electrodes GC are arranged to extend perpendicular to the bit line BL and the bit line /BL. Either one of the source and the drain formed in the active area AA is connected through contact CNT1 to the bit line BL (or the bit line /BL). The other one of the source and the drain formed in the active area AA is connected through contact CNT2 to the resistance change memory element R. Each resistance change memory element R extends along an axis parallel to the principal plane of the semiconductor substrate.

Figure 5:
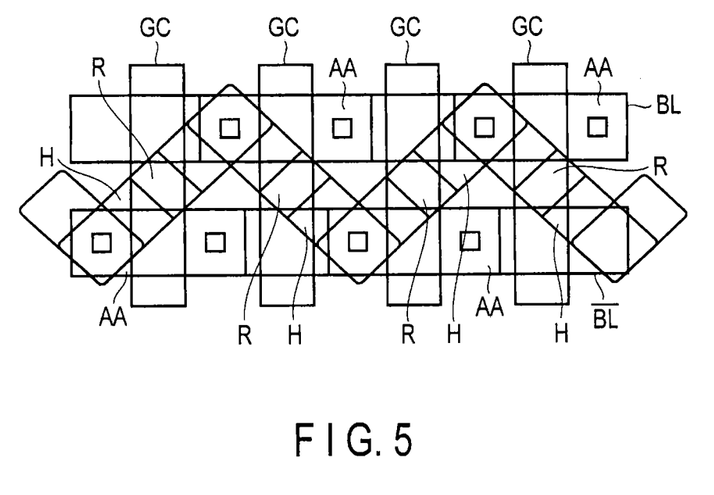
FIG. 5 is a view schematically illustrating the planar composition of the exemplary modification of the first exemplary device structure of the semiconductor memory device in the first embodiment.
Figure 6:
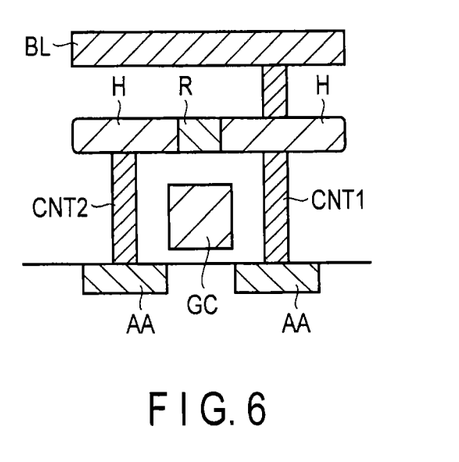
FIG. 6 is a view schematically illustrating the sectional composition of the exemplary modification of the first exemplary device structure of the semiconductor memory device in the first embodiment.

FIG. 5 is a view (planar pattern figure) schematically illustrating the planar composition of the exemplary modification of the first exemplary device structure. FIG. 6 is a view schematically illustrating the sectional composition of the exemplary modification of the first exemplary device structure.

A resistance change memory element R occupies the whole area between any two adjacent contacts CNT2 in the exemplary composition illustrated in FIG. 3 or FIG. 4. In this exemplary modification, a resistance change memory element R occupies only a part of the area between any two adjacent contacts CNT2, and the resistance change memory element R is connected to the contact CNT2 by means of interconnecting section H.

Figure 7:
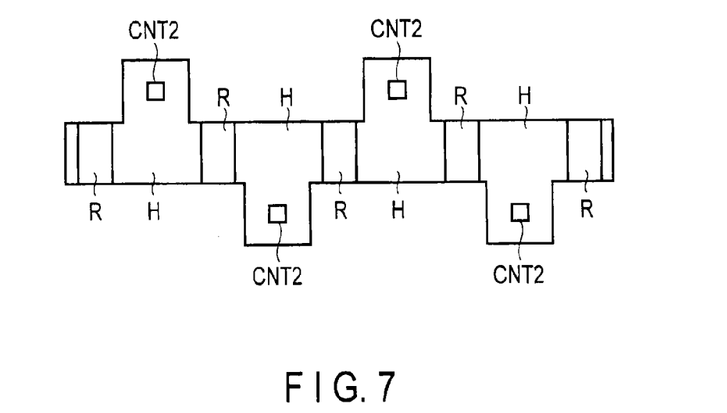
FIG. 7 is a view schematically illustrating the planar composition of another exemplary modification of the first exemplary device structure of the semiconductor memory device in the first embodiment.

It should be noted that, although the resistance change memory elements R and the interconnections H are arranged to form a zigzag line in the above mentioned exemplary modification, it is possible to arrange the resistance change memory elements R and the interconnections H to from a straight line as illustrated in FIG. 7.

Figure 8:
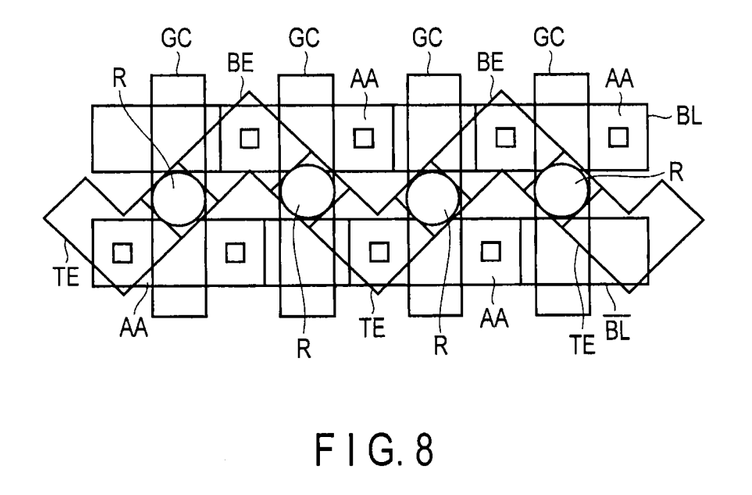
FIG. 8 is a view schematically illustrating the planar composition of the second exemplary device structure of the semiconductor memory device in the first embodiment.
Figure 9:
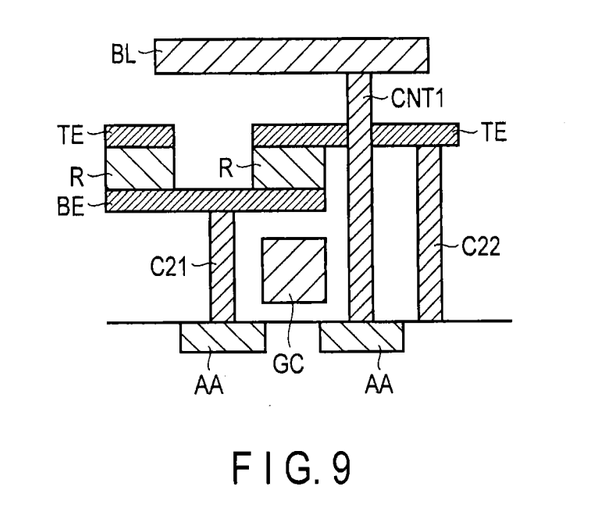
FIG. 9 is a view schematically illustrating the sectional composition of the second exemplary device structure of the semiconductor memory device in the first embodiment.

FIG. 8 is a view (planar pattern figure) schematically illustrating the planar composition of the second exemplary device structure of the semiconductor memory device in the present embodiment. FIG. 9 is a view schematically illustrating the sectional composition of the second exemplary device structure of the semiconductor memory device in the present embodiment.

In this compositional example, the two ends of each resistance change memory element are arranged along an axis perpendicular to the principal plane of the semiconductor substrate where the select transistors and the read only select transistors are provided.

Specifically, the bit line BL and the bit line /BL are arranged to extend in parallel with each other, whereas the gate electrodes GC are arranged to extend perpendicular to the bit line BL and the bit line /BL. Either one of the source and the drain formed in the active area AA is connected through contact CNT1 to the bit line BL (or the bit line /BL). The other one of the source and the drain formed in the active area AA is connected to the resistance change memory element R. That is, the other one of the source and the drain is connected to the resistance change memory element R through the contact C21 and the lower electrode (bottom electrode) BE. Alternatively, the other one of the source and the drain is connected to the resistance change memory element R through the contact C22 and the upper electrode (top electrode) TE.

When the composition mentioned above is adopted, an average memory cell size will be set to 4F×2F=8F$^2$, where F stands for a minimum line width.

It should be noted that the device structure is not limited to the first and the second exemplary device structure mentioned above. For example, it is possible to use a three-dimensional structure.

Figure 10:
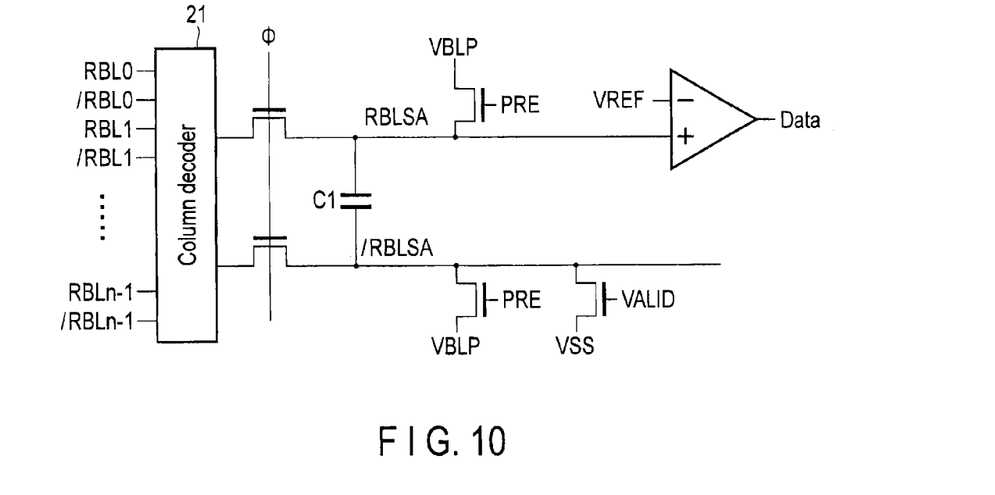
FIG. 10 is an electric diagram illustrating the composition of the data detection circuit of the semiconductor memory device in the first embodiment.
Figure 11:
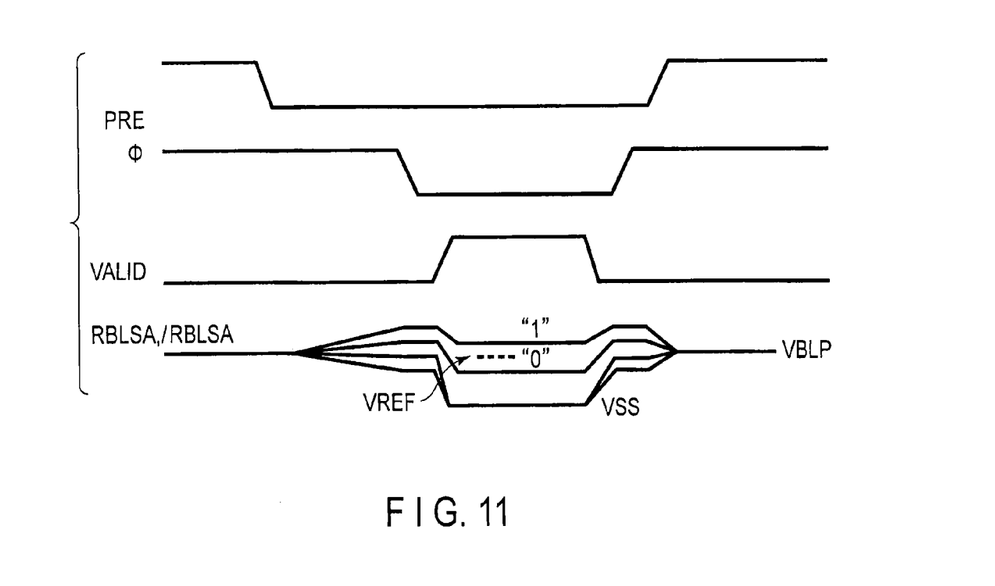
FIG. 11 is a timing chart illustrating operation of the data detection circuit illustrated in FIG. 10.

FIG. 10 is an electric diagram illustrating the composition of the data detection circuit in the present embodiment. The data detection circuit illustrated in FIG. 10 detects data (0 or 1) written to the resistance change memory element. FIG. 11 is a timing chart illustrating operation of the data detection circuit illustrated in FIG. 10.

For example, when the potential difference between the two ends of each of the resistance change memory elements illustrated in FIG. 1 should be detected, the resistance of each select transistor or the resistance of the bit line BL or /BL may cause the potential of the bit line RBL and that of the bit line /RBL to shift from their respective potentials which should be detected. Therefore, BL potential>RBL potential>/RBL potential>/BL potential will be established. This means that there is a possibility that exact data detection cannot be performed simply by comparing RBL potential with the reference potential VREF.

In this embodiment, the bit lines RBL and /RBL are previously charged in the condition that signal Φ and signal PRE are in a high state, so that non-selected resistance change memory elements may be minimally disturbed. Subsequently, a resistance change memory element is selected and the bit lines RBL and /RBL are made to generate a signal difference. The generated signal difference is stored up in the capacitor C1 dedicated to sample-and-hold. Then, signal VALID is made high, and bit line /RBL is made to have potential VSS. Thereby, potential of bit line RBL is established relative to the potential of bit line /RBL. A comparator compares the potential obtained in this way of bit line RBL with reference potential VREF. The data written to the resistance change memory element can be assessed based on the comparison data from the comparator.

It should be noted that the above mentioned circuit may be used for the assessment of whether the write voltage greater than VREF is applied to the selected resistance change memory element, and the assessment result may be fed back to BL potential and /BL potential, or a current generation circuit. Moreover, it is possible to perform a multi-value determination using two or more reference potentials VREF.

As mentioned above, even if transistors or bit lines should vary in resistance, change of the current which flows through the resistance change memory elements or change of the voltage applied to the resistance change memory elements will be surely suppressed, so that read operation and write operation will be suitably performed in this embodiment.

Moreover, since the transistor count per memory cell can be reduced, it becomes possible to make cell size per memory cell small in this embodiment.

Embodiment 2

Figure 12:
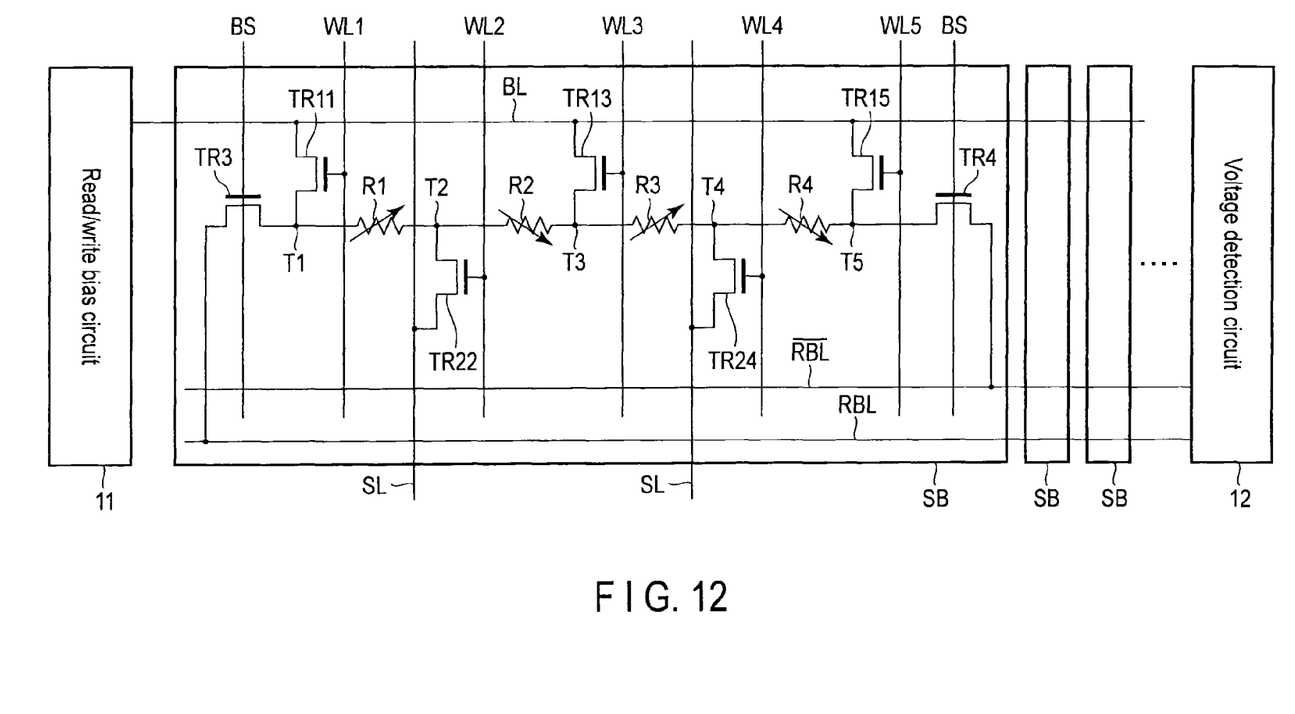
FIG. 12 is a view illustrating the structure of the equivalent circuit of a semiconductor memory device in the second embodiment.

FIG. 12 is a view illustrating the structure of an equivalent circuit of a semiconductor memory device in the second embodiment. It should be noted that the second embodiment is much the same as the first embodiment in fundamental matters, so that the explanation of those matters that have been already explained when the first embodiment was presented will be omitted.

In this embodiment, one of the first bit line and the second bit line, the third bit line and the fourth bit line extend along a first axis, whereas the other of the first bit line and the second bit line extends along a second axis perpendicular to the first axis. Specifically, the first bit line BL, the third bit line RBL and the fourth bit line /RBL extend horizontally (along the first axis), whereas common source line (second bit line) SL extends perpendicularly (along the second axis).

When a voltage is applied to the selected resistance change memory element, the voltage may be applied to the bit line BL in the condition that the voltage of common source line SL is fixed. Moreover, when bipolar cells are used, a positive and a negative voltage may be applied to the bit line BL.

Figure 13:
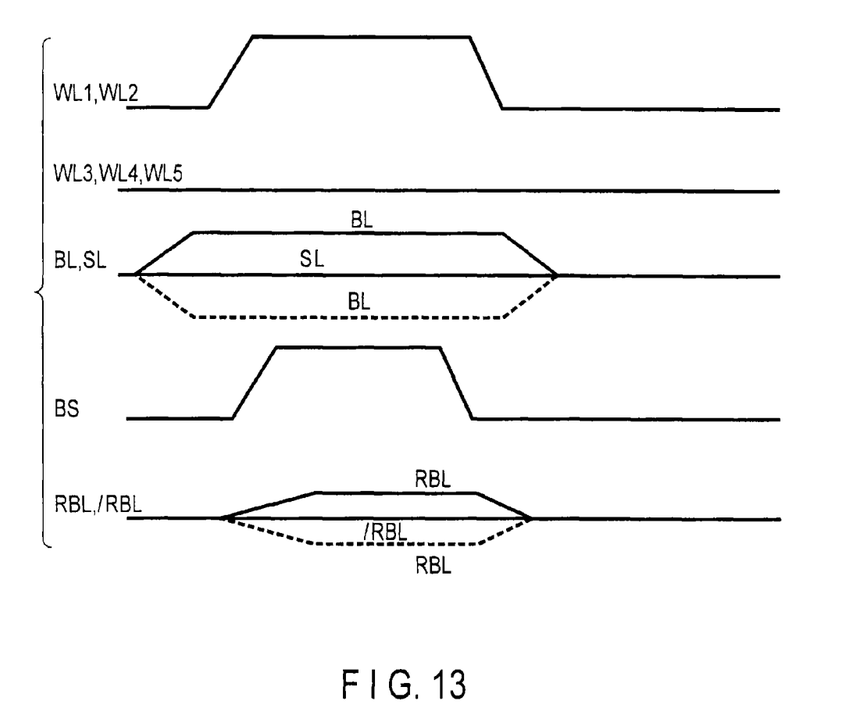
FIG. 13 is a timing chart illustrating read operation of the semiconductor memory device in the second embodiment.

FIG. 13 is a timing chart which illustrates the operation in the case of applying positive and negative voltage to the bit line BL. As illustrated in FIG. 13, positive and negative voltage is applied to the bit line BL relative to common source line SL.

In addition, the potential of common source line SL may be lowered and the potential difference of a positive direction may be controlled by potential given to the bit line BL. Alternatively, the potential of common source line SL may be raised and the potential difference of the negative direction may be controlled by potential given to the bit line BL.

Since the basic matter is the same as that of the first embodiment, this embodiment can also acquire the same effect as the first embodiment.

Moreover, since wide common source line SL can be used, parasitic resistance of common source line SL can be made small in this embodiment.

It should be noted that the following materials may be used for a resistance change memory element in the first and the second embodiment mentioned above: chalcogenide material containing GeSbTe, superlattice material of GeTe and SbTe, binary or ternary transition metal oxide material, oxide material containing Au or Cu, chalcogenide material containing Au or Cu, or ferromagnetic material. It is possible to apply the resistance change memory element using any of the above-mentioned materials to a semiconductor memory device such as a phase change memory (PRAM, PCM), a resistance change memory (RRAM, ReRAM) and a magnetoresistive memory (MRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a series connection including first to Nth (N being an integer greater than or equal to 2) two-terminal-type resistance change memory elements connected in series with one another, and having first to (N+1)th terminals from one end thereof to the other end thereof;
   a first, second, third, and fourth bit lines;
   first transistors connected between the first bit line and odd-numbered terminals of the series connection;
   one or more second transistors connected between the second bit line and one or more even-numbered terminals of the series connection;
   a third transistor connected between the third bit line and the first terminal of the series connection; and
   a fourth transistor connected between the fourth bit line and the (N+1)th terminal of the series connection.

2. The device of claim 1 wherein,
   when information is read from the jth (j is an integer which satisfies 1≤j≤N) resistance change memory element,
   the first and second transistors connected to the jth and (j+1)th terminals are set in an ON state, and a voltage is applied between the first and second bit lines; and
   the third and fourth transistors are set in an ON state, and a voltage applied to the jth resistance change memory element is read between the third and fourth bit lines.

3. The device of claim 2, wherein,
   when information is written to the kth (k is an integer which satisfies 1≤k≤N) resistance change memory element,
   the first and second transistors connected to the kth and (k+1)th terminals are set in an ON state, and
   a voltage or a current according to the information to be written to the kth resistance change memory element is supplied between the first and second bit lines.

4. The device of claim 3, wherein,
   when the information is written to the kth resistance change memory element,
   the third and fourth transistors are set in an ON state, and a voltage applied to the kth resistance change memory element is read between the third and fourth bit lines, and the voltage or the current supplied between the first and second bit lines is controlled based on the voltage read between the third and fourth bit lines.

5. The device of claim 3, wherein each of the first to Nth resistance change memory elements has two ends arranged in parallel to a principal plane of a semiconductor substrate in which the first, second, third, and fourth transistors are provided.

6. The device of claim 3, wherein each of the first to Nth resistance change memory elements has two ends arranged perpendicularly to a principal plane of a semiconductor substrate in which the first, second, third, and fourth transistors are provided.

7. The device of claim 3, wherein the first to Nth resistance change memory elements are selected from a chalcogenide material containing GeSbTe, a superlattice material of GeTe and SbTe, a binary or ternary transition metal oxide material, an oxide material containing Au or Cu, a chalcogenide material containing Au or Cu, and a ferromagnetic material.

8. The device of claim 3, wherein the first, second, third, and fourth bit lines extend parallel to one another.

9. The device of claim 3, wherein the third bit line, the fourth bit line, and one of the first and second bit lines extend to a first direction, and the other of the first and second bit lines extends to a second direction perpendicular to the first direction.

10. The device of claim 1, wherein,
when information is written to the kth (k is an integer which satisfies 1≤k≤N) resistance change memory element,
the first and second transistors connected to the kth and (k+1)th terminals are set in an ON state, and
a voltage or a current according to the information to be written to the kth resistance change memory element is supplied between the first and second bit lines.

11. The device of claim 10, wherein,
when the information is written to the kth resistance change memory element,
the third and fourth transistors are set in an ON state, and a voltage applied to the kth resistance change memory element is read between the third and fourth bit lines, and
the voltage or the current supplied between the first and second bit lines is controlled based on the voltage read between the third and fourth bit lines.

12. The device of claim 1, wherein each of the first to Nth resistance change memory elements has two ends arranged in parallel to a principal plane of a semiconductor substrate in which the first, second, third, and fourth transistors are provided.

13. The device of claim 1, wherein each of the first to Nth resistance change memory elements has two ends arranged perpendicularly to a principal plane of a semiconductor substrate in which the first, second, third, and fourth transistors are provided.

14. The device of claim 1, wherein the first to Nth resistance change memory elements are selected from a chalcogenide material containing GeSbTe, a superlattice material of GeTe and SbTe, a binary or ternary transition metal oxide material, an oxide material containing Au or Cu, a chalcogenide material containing Au or Cu, and a ferromagnetic material.

15. The device of claim 1, wherein the first, second, third, and fourth bit lines extend parallel to one another.

16. The device of claim 1, wherein the third bit line, the fourth bit line, and one of the first and second bit lines extend to a first direction, and the other of the first and second bit lines extends to a second direction perpendicular to the first direction.

* * * * *